Figure 1:
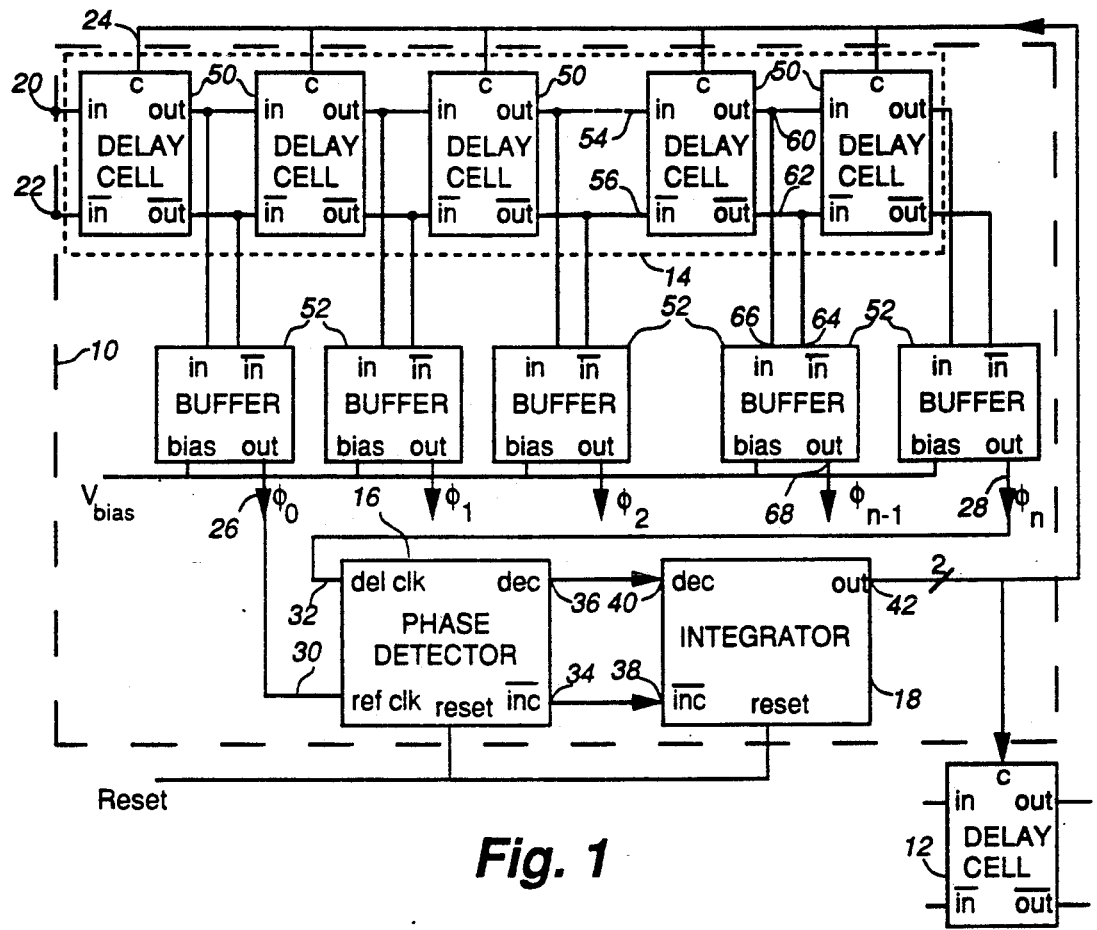

United States Patent [19]

Searles et al.

[11] Patent Number: 5,179,303
[45] Date of Patent: Jan. 12, 1993

[54] SIGNAL DELAY APPARATUS EMPLOYING A PHASE LOCKED LOOP

[75] Inventors: Shawn Searles, Ottawa; Richard G. Kusyk, Kanata, both of Canada

[73] Assignee: Northern Telecom Limited, Montreal, Canada

[21] Appl. No.: 913,659

[22] Filed: Jul. 16, 1992

Related U.S. Application Data

[63] Continuation-in-part of Ser. No. 782,353, Oct. 24, 1991, Pat. No. 5,146,121.

[51] Int. Cl.⁵ .................. H03K 5/13; H03K 5/159
[52] U.S. Cl. .................... 307/603; 307/594; 307/595; 307/608; 328/55; 328/155
[58] Field of Search .............. 307/603, 605, 608, 591, 307/594-595, 262; 328/55, 155

[56] References Cited

U.S. PATENT DOCUMENTS

| | | | |
|---|---|---|---|
| 4,494,021 | 1/1985 | Bell et al. | 307/606 |
| 4,641,048 | 2/1987 | Pollock | 307/608 |
| 4,795,923 | 1/1989 | Dobos | 307/608 |
| 4,922,141 | 5/1990 | Lofgren et al. | 307/603 |
| 4,994,687 | 2/1991 | Fujii et al. | 307/602 |
| 5,059,838 | 10/1991 | Montegi et al. | 307/606 |
| 5,066,877 | 11/1991 | Hamano et al. | 307/608 |
| 5,146,121 | 9/1992 | Searles et al. | 307/262 |

Primary Examiner—William L. Sikes
Assistant Examiner—Margaret Rose Wambach
Attorney, Agent, or Firm—Dallas F. Smith

[57] ABSTRACT

An apparatus is provided for delaying digital data signals by fixed amounts within an integrated circuit. A delay lock loop includes an adaptive delay line, a phase detector and an integrator. The integrator provides control signals $c_p$, $c_n$ for controlling the delay line, in dependence upon the relative phase of a reference clock signal $\phi_0$ and a delayed clock signal $\phi_n$. The delay line includes a plurality of delay cells. By maintaining a phase relationship $\phi_n = \phi_0 + 360°$ one clock cycle, $T_c$, delay through the delay line is provided. Thus each delay cell provides $T_c/n$ delay. By placing identical cells in signal paths elsewhere on a chip, fixed delays can be introduced which are controlled by the delay lock loop. A harmonic lock detector connected to a plurality of clock phase taps from the delay line detects harmonic lock conditions for second through tenth harmonics, resetting the delay lock loop in the event of harmonic lock.

8 Claims, 5 Drawing Sheets

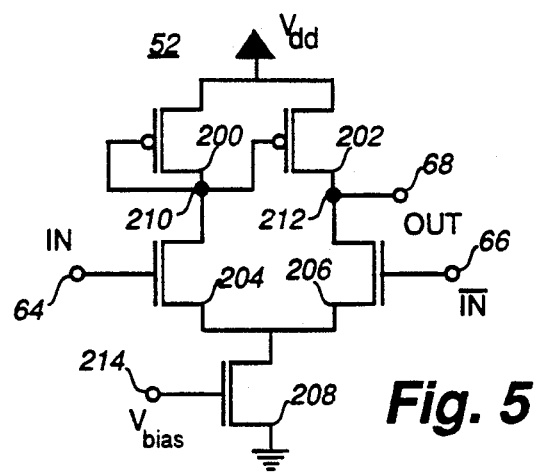
Fig. 5
Fig. 6
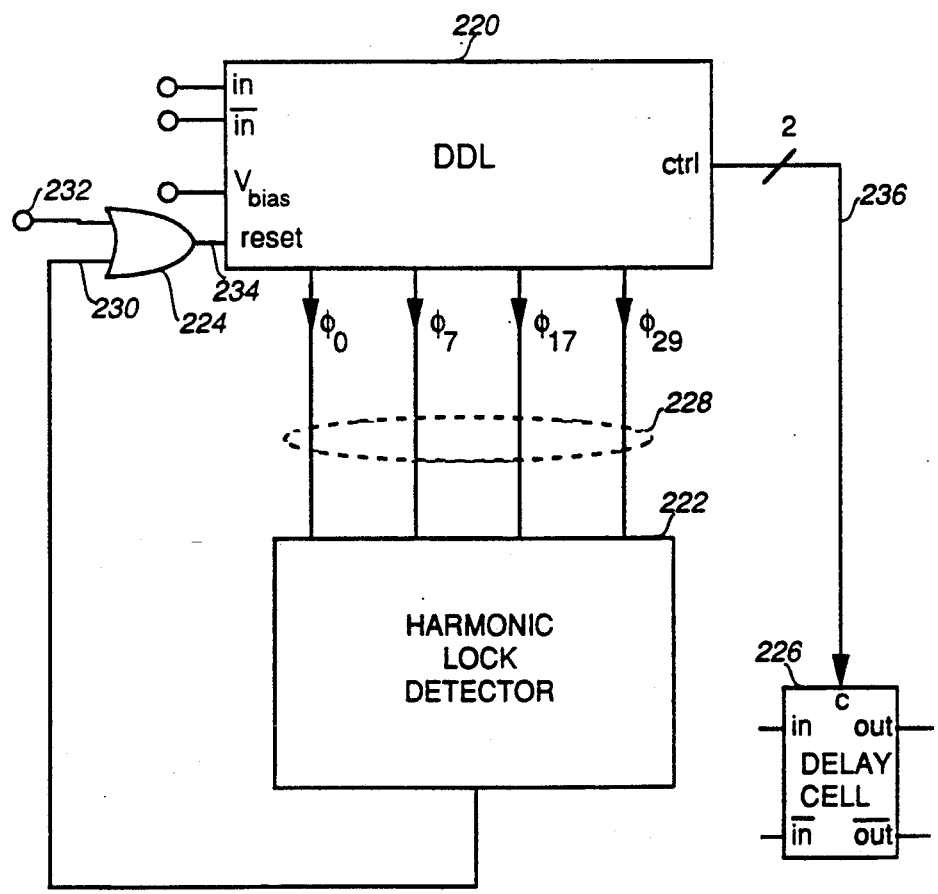

SIGNAL DELAY APPARATUS EMPLOYING A PHASE LOCKED LOOP

This application is a continuation-in-part of application Ser. No. 07/782,353, filed Oct. 24, 1991 now U.S. Pat. No. 5,146,121.

This invention relates to an apparatus for providing a plurality of phase-shifted clock signals from a reference clock signal using a delay lock loop (DLL) and is particularly concerned with providing a fixed delay cell controlled by the DLL for introducing fixed delays in the data signals.

Silicon BiCMOS integrated circuits introduce wide time differences or deltas between their best case propagation delays and their worst case propagation delays. The deltas are primarily due to operating temperature variation, supply voltage variation and chip processing variation. The variability of the delays means that standard delay elements can not be relied upon to provide a fixed time delay as the delay elements are themselves subject to the same variations. A delay line is required that compensates for propagation delays resulting from operating temperature variation, supply voltage variation and chip processing variation.

An object of the present invention is to provide an improved circuit for providing substantially constant delays in signal paths within an integrated circuit.

In accordance with one aspect of the present invention there is provided a circuit for providing an on-chip substantially constant delay in a signal path, comprising: a delay cell within the signal path requiring a substantially constant delay, the delay cell including a CMOS differential amplifier having pullup and pulldown currents being controlled by first and second control signals, respectively; and the delay lock loop including: a delay line comprising a plurality of serially connected delay cells identical to the delay cell within the signal path, an input for receiving a reference clock signal, and an output for providing a delayed clock signal; a phase detector connected to the delay line and having outputs indicative of a phase difference between the delayed clock signal relative to the reference clock signal; a charge pump connected to the outputs of the phase detector and having a capacitor for providing an output signal therefrom; a bias generator having an input connected to receive the output signal of the charge pump for providing first and second control signals; and a harmonic lock detector having a plurality of inputs connected to a preselected plurality of delay cells for receiving multiple phases of the clock signal and an output for providing a harmonic lock indication signal in dependence upon relative phases of the phase of the clock signal.

In accordance with another aspect of the present invention there is provided a circuit for providing an on-chip substantially constant delay in a signal path, comprising: a delay cell within the signal path requiring a substantially constant delay, the delay cell including a CMOS differential amplifier having a NMOS transistor for controlling the pulldown current from a differential-pair in response to a first control signal and a PMOS transistor for controlling the pullup current to a complementary differential pair in response to a second control signal; and the delay lock loop including: a delay line comprising a plurality of serially connected delay cells identical to the delay cell within the signal path, an input for receiving a reference clock signal, and an output for providing a delayed clock signal; a phase detector connected to the delay line and having outputs indicative of a phase difference between the delayed clock signal relative to the reference clock signal; a charge pump connected to the outputs of the phase detector and having a capacitor for providing an output signal therefrom; and a bias generator having an input connected to receive the output signal of the charge pump for providing first and second control signals.

Preferably, the delay line includes an output for providing a delayed clock signal and the control signal is dependent upon a phase of the delayed clock signal with respect to the reference clock signal.

In an embodiment of the present invention the delay lock loop includes a phase detector connected to the delay line for determining the relative phase of the delayed clock signal.

Figure 2:
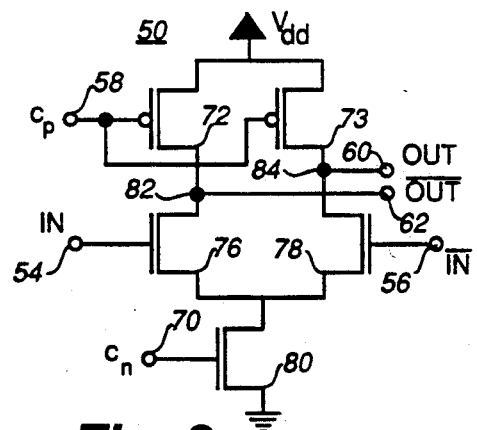
Figure 3:
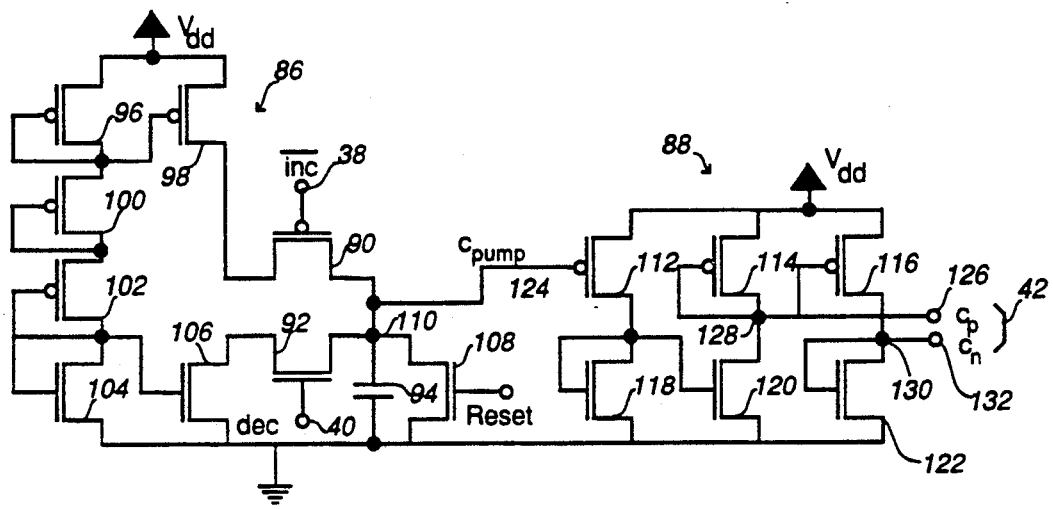
Figure 4:
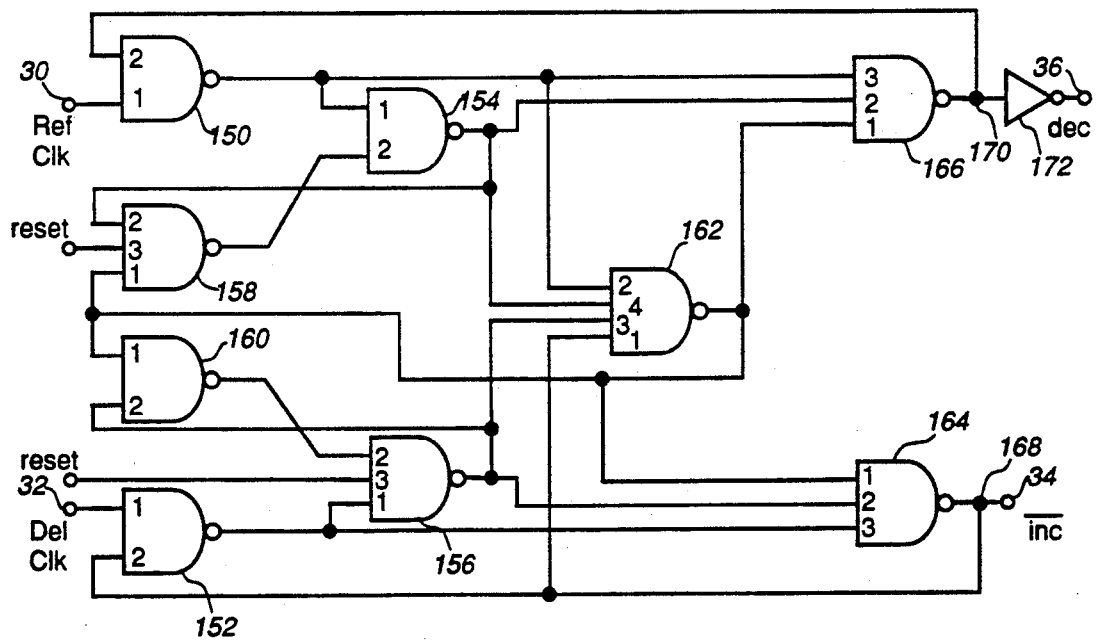
Figure 7:
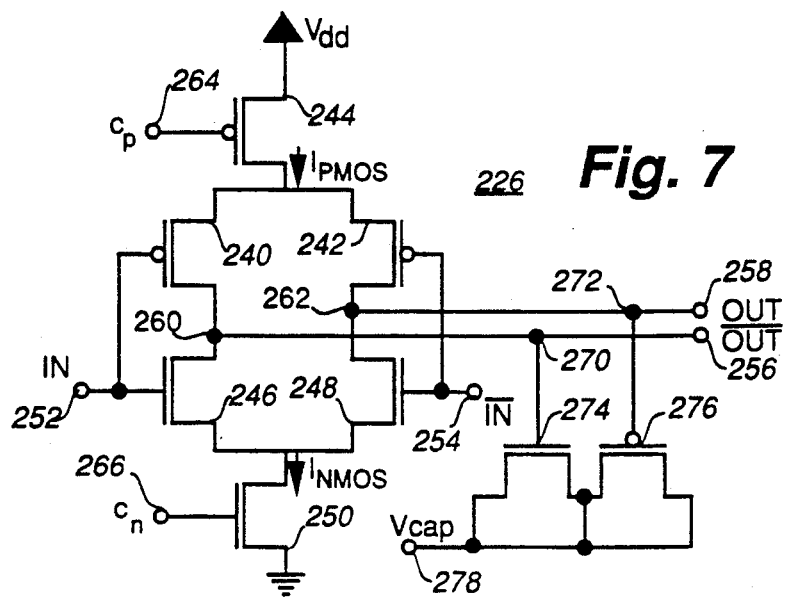
Figure 8:
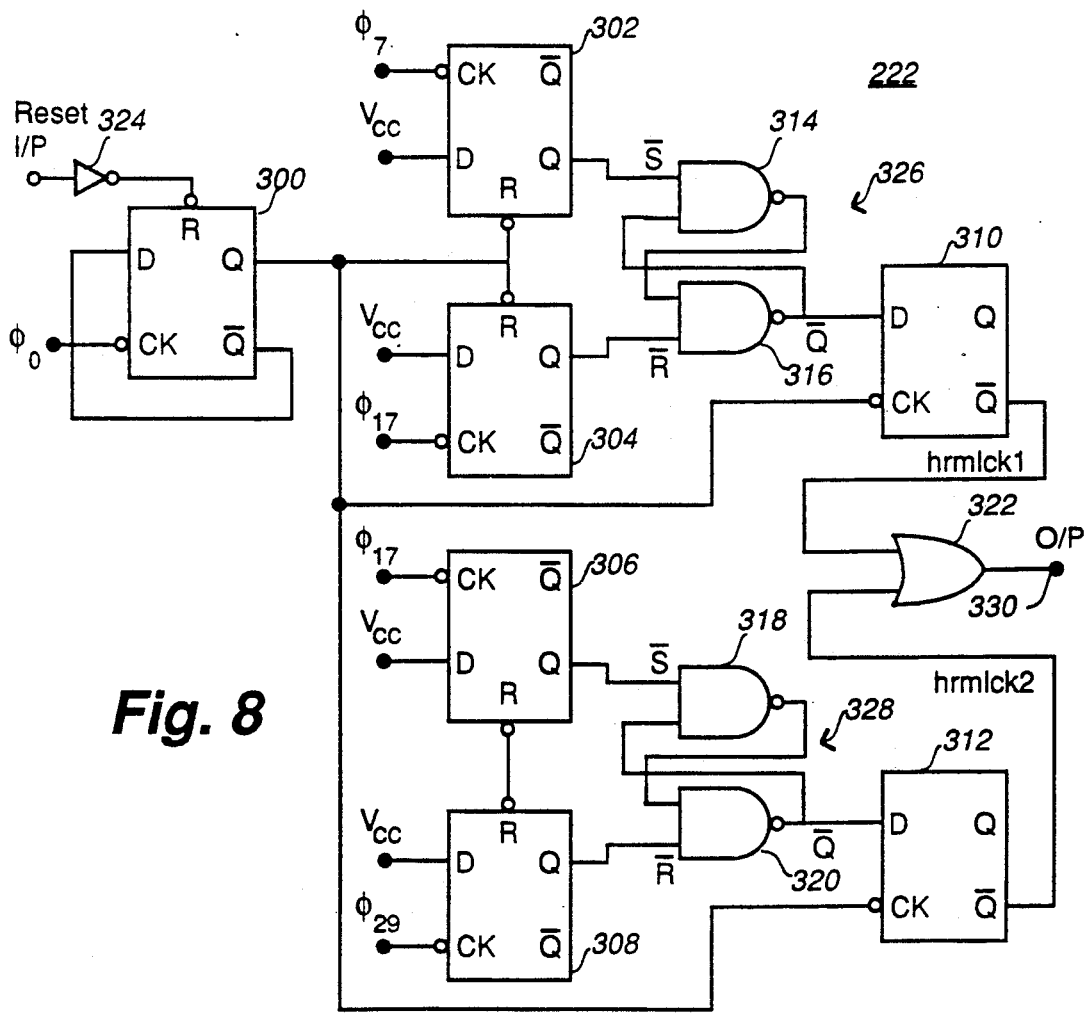

The present invention will be further understood from the following description with reference to the drawings in which:

FIG. 1 illustrates in block diagram a circuit for providing a constant delay in accordance with an embodiment of the present invention;

FIG. 2 schematically illustrates the delay cell of FIG. 1;

FIG. 3 schematically illustrates the integrator of FIG. 1;

FIG. 4 illustrates the phase detector of FIG. 1;

FIG. 5 schematically illustrates the buffer of FIG. 1;

FIG. 6 illustrates in a block diagram a circuit for providing a constant delay in accordance with a second embodiment of the present invention;

FIG. 7 schematically illustrates the delay cell of FIG. 6;

FIG. 8 schematically illustrates the harmonic lock detector of FIG. 6; and

Figure 9:
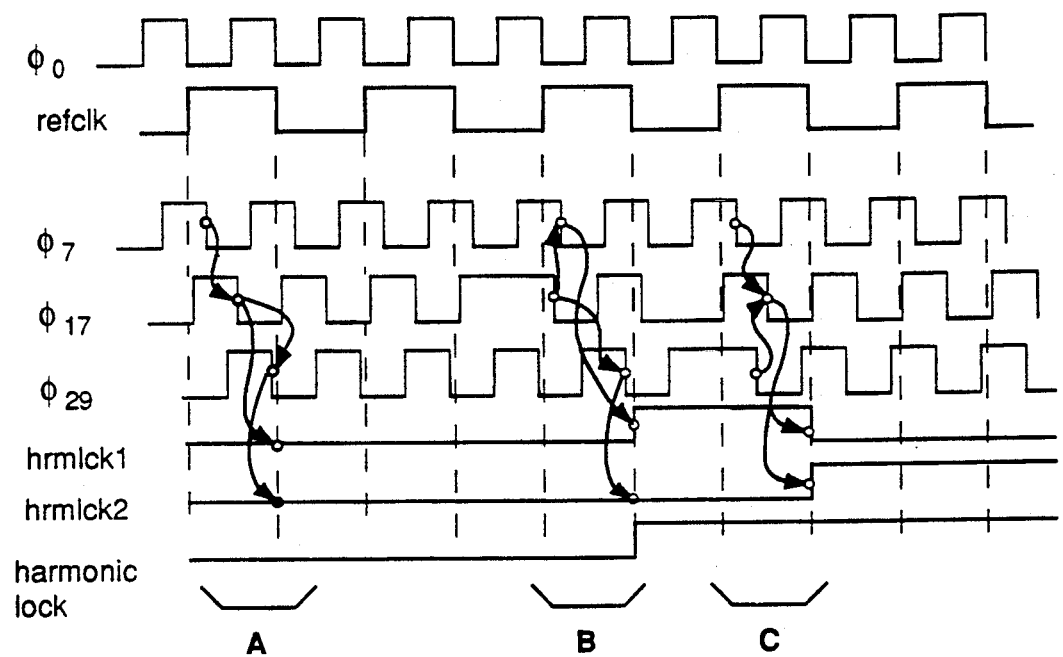

FIG. 9 graphically illustrates a timing diagram indicative of the operation of the harmonic lock detector of FIG. 8.

Referring to FIG. 1, there is illustrated in a block diagram a circuit for providing a constant delay, in accordance with an embodiment of the present invention.

The circuit includes a delay lock loop (DLL) 10 and a delay cell 12. The DLL 10 includes an adaptive delay line 14, a phase detector 16, and a integrator 18. The delay line 14 has clock and inverse clock inputs 20 and 22, respectively, a control input 24, and at least two clock outputs, 26 and 28, providing clock phases $\phi_o$ and $\phi_n$, respectively. The clock outputs 26 and 28 are coupled to the phase detector 16 inputs 30 and 32, respectively. The input 30 is for receiving a reference clock input and the input 32 is for receiving a delayed clock input. The phase detector 16 has outputs 34 and 36 for indicating a required increase or decrease in clock phase. The outputs 34 and 36 are coupled to corresponding increase and decrease inputs 38 and 40 of the integrator 18. The integrator 18 has an output 42 coupled to the control input 24 of the delay line 14 for controlling the time delay thereof.

The delay line 14 includes n+1 delay cells 50 and n+1 buffers 52. Each delay cell 50 comprises a differential amplifier including noninverting and inverting inputs 54 and 56, control inputs 58 and 70, and noninverting and inverting outputs 60 and 62. Each buffer 52 includes noninverting and inverting inputs 64 and 66 and a single output 68. The buffers 52 convert the differential outputs, 60 and 62, of the delay cells 50 to single outputs 68 and present a constant output capacitance to the delay cells.

In operation, the delay line 14 provides one clock cycle of delay between clock outputs 26 and 28, thus, $\phi_o + 360° = \phi_n$. The DLL 10 including the delay line 14, the phase detector 16 and the integrator 18 controls the delay line 14 to maintain the phase relationship of $\phi_o$ and $\phi_n$, over varying conditions of operating temperature, manufacturing process, and voltage supply. When such conditions cause a difference between $\phi_o$ and $\phi_n$, the phase detector 16 senses the phase change and signals an increase or decrease in phase, as appropriate, via outputs 34 and 36, respectively. The integrator 18 responds to the signal at input 38 or 40 by providing control signals $c_p$, $c_n$ at the output 42. The control signals $c_p$ and $c_n$ are applied to the delay line 14 via the control input 24 to increase or decrease the delay provided by the delay line 14. Hence, the delay line 14 is controlled to provide a one clock cycle delay independent of variations in temperature, voltage, and process. Consequently, each delay cell within the delay line 14 provides a constant delay interval $T_c/n$, where $T_c$ is the reference clock period and n is the number delay cells between clock outputs 26 and 28.

The delay cell 12, which is not a part of the delay line 14, but is identical to the delay cell 50 described hereinabove, is also controlled by the control signals $c_p$, $c_n$. Hence, the delay cell 12 can be placed anywhere on a chip to provide a fixed delay $T_c/n$ within a signal path. Similarly, a plurality of m delay cells can be series connected to provide a delay of $m(T_c/n)$ The delay cell 14 can also be used to multiply the reference clock frequency by XORing the clock with a delayed clock.

The delay line 14 can be used in conjunction with a multiplexer and a phase selector to provide any one of n phase-shifted reference clocks.

Referring to FIG. 2, there is schematically illustrated the delay cell in accordance with an embodiment of the present invention. The delay cell 50 is a CMOS differential amplifier including PMOS transistors 72 and 73 and NMOS transistors 76, 78, and 80. The noninverting input 54 and inverting input 56 are connected to the gates of NMOS transistors 76 and 78, respectively. The noninverting output 60 and the inverting output 62 are connected to nodes 82 and 84 between PMOS and NMOS transistors 72 and 76, and 73 and 78, respectively. The control signals $c_p$ and $c_n$ are applied to control inputs 58 and 70, respectively. The input 58 is connected to the gates of PMOS transistors 72 and 73. The input 70 is connected to the gate of NMOS transistor 80.

In operation, the delay through the delay cell 50 results from the charging and discharging of the capacitances on the nodes 82 and 84. The delay through the delay cell 50 can be altered by adjusting both the tail current INMOS and the pullup current IPMOS through the control signals $c_n$ and $c_p$, respectively. The control signal $c_p$ is applied to the gates of the PMOS transistors 72 and 73 via the control input 58. The control signal $c_n$ is applied to the gate of the NMOS transistor 80 via the control input 70.

A ratio $I_{PMOS}/I_{NMOS} = \frac{1}{3}$ and a 2× pulldown by the NMOS transistor 80, have been found to provide satisfactory operation over all control voltages. The delay cell 50 requires $I_{PMOS}$ and $I_{NMOS}$ operate in a nonsaturated state over all control voltages. The control voltage swing is 0 V to Vdd. The control signals $c_p$ and $c_n$ are described in connection with FIG. 3.

Referring to FIG. 3 there is schematically illustrated the integrator in accordance with an embodiment of the present invention. The integrator 18 comprises a charge pump 86 and a bias generator 88. The charge pump 86 includes PMOS transistors 90, 96, 98, 100, and 102 and NMOS transistors 92, 104, 106, and 108 connected as shown in FIG. 3. The increase input 38 is connected to the gate of PMOS transistor 90 and the decrease input 40 is connected to the gate of NMOS transistor 92. The increase and decrease inputs 38 and 40 are used to control the charging and discharging of a capacitor 94 connected between a node 110 and ground. The voltage of the capacitor 94 at the node 110 provides an output signal $c_{pump}$ which is used to control the bias generator 88. The NMOS transistor 108 has a reset input connected to its gate.

The bias generator comprises PMOS transistors 112, 114, and 116 and NMOS transistors 118, 120, and 122 connected as shown in FIG. 3. The control output signal $C_{pump}$ is applied to the PMOS transistor 112 via its gate 124. The control signals $c_p$ and $c_n$ are provided via outputs 42 including line 126 connected to a node 128 and line 132 connected to a node 130. The node 128 links the PMOS transistor 114 and the NMOS transistor 120 and has connected to it the gate of the PMOS transistors 114 and 116. The node 130 links the PMOS transistor 116 and the NMOS transistor 122 and has connected to it the gate of NMOS transistor 122.

In operation, the phase detector 16 provides either an increase or decrease signal to inputs 38 and 40, respectively, of the charge pump 86. The presence of an increase signal at the input 38 causes the PMOS transistor 90 to conduct current thereby increasing a charge on the capacitor 94 and raising the voltage at the node 110 which provides the control signal $c_{pump}$. Conversely, the presence of a decrease signal at the input 40 causes the NMOS transistor 92 to conduct current thereby decreasing the charge on the capacitor 94, and lowering the voltage at the node 110. The voltage at the node 110 is applied to the gate 124 of the PMOS transistor 112. Resultant voltages at nodes 128 and 130, the gate voltages of PMOS transistors 114 and 116 and NMOS transistor 122, respectively, become the signals $c_p$ and $c_n$, respectively.

Referring to FIG. 4, there is illustrated the phase detector in accordance with an embodiment of the present invention. The phase detector 16 consists of a well known nine NAND gate circuit, the nine gates (150-166) connected in a symmetrical arrangement as shown in FIG. 4. The numbering of the inputs of the NAND gates indicate the speed of the inputs, No. 1 being the fastest input (the input connected to the transistor closest to the output).

The NAND gates 150 and 152 have the reference clock input 30 and the delayed clock input 32 connected to their respective No. 1 inputs. The outputs of NAND gates 164 and 166 are connected to nodes 168 and 170, respectively. The increase output 34, (inc), is connected directly to the node 168. The decrease output 36, (dec), is connected to the node 170 via an inverter 172.

The on-chip layout of the phase detector is important. The symmetry of the device must be preserved. The NAND gate 162 must drive out in a symmetrical manner. Also, the connection of Ref Clk input 30 to the node 170 and Del Clk input 32 to the node 168 should be longer than the connection from the NAND gate 162 to the node 170.

The last block of FIG. 1 to be described in detail is the buffer 52. Referring to FIG. 5, there is schematically illustrated the buffer of FIG. 1, in accordance with an embodiment of the present invention. The buffer 52 includes PMOS transistors 200 and 202 and NMOS transistors 204, 206, and 208 connected as shown in FIG. 5. The gates of PMOS transistors 200 and 202 are connected to a node 210. The node 210 links PMOS transistor 200 to NMOS transistor 204. The noninverting input 64 and the inverting input 66 are connected to the gates of NMOS transistors 204 and 206, respectively. The output 68 is connected to a node 212. The node 212 links the PMOS transistor 202 and the NMOS transistor 206. The NMOS transistor 208 is used to set the pulldown current under the control of $V_{bias}$ at its gate 214. In operation, the bias voltage $V_{bias}$ can be the same as $c_n$ in which case the buffer 52 provides a delay similar to the delay cell 50. If less delay is desirable in the buffer and power consumption is not a concern, $V_{bias}$ can be raised to reduce the delay in the buffer 52.

Referring to FIG. 6, there is illustrated in a block diagram a circuit for providing a constant delay in accordance with a second embodiment of the present invention. The circuit includes a delay lock loop (DDL) 220, a harmonic lock detector 222, an OR gate 224, and a delay cell 226: A bus 228 connects $\phi_o$ and three delayed clock phases from the DDL 220 to a harmonic lock detector 222. For example, in a DDL with n=32, the clock phases are $\phi_7$, $\phi_{17}$, and $\phi_{29}$. The harmonic lock detector 222 output is connected to an input 230 of the OR gate 224. The other input 232 of the OR gate is an input for a global reset signal. The output of the OR gate 224 is connected to a reset input 234 of DDL 220. The control signals $c_p$ and $c_n$ are provided to the delay cell 226 via a bus 236. The embodiment of FIG. 6 differs from that of FIG. 1 in having a modified delay cell 226 and corresponding delay stages within the DDL 220 (not shown in FIG. 6) and with the addition of the harmonic lock detector 222 and OR gate 224. The modified delay cell is schematically illustrated in FIG. 7. The harmonic lock detector is schematically illustrated in FIG. 8.

In operation, the circuit of FIG. 6 provides a constant delay in a manner similar to that of FIG. 1, except for the reset in the event of a harmonic lock being detected. The harmonic lock detector 222 detects when a harmonic lock condition exists and provides a reset signal via the OR gate 224 to reset the DDL 220. The operation of the delay cell 226 is described hereinbelow with respect to FIG. 7. Detail of how the harmonic lock detector 222 provides the reset signal, is provided hereinbelow with respect to FIG. 8.

Referring to FIG. 7, there is schematically illustrated the delay cell 226 in accordance with the second embodiment of the present invention. The delay cell 226 is a CMOS differential amplifier including PMOS transistors 240, 242, and 244 and NMOS transistors 246, 248, and 250. A noninverting input 252 is connected to the gates of the PMOS transistor 240 and the NMOS transistor 246. An inverting input 254 is connected to the gates of PMOS transistor 242 and NMOS transistor 248. An inverting output 256 and noninverting output 258 are connected to nodes 260 and 262, respectively. The nodes 260 and 262 are located between PMOS and NMOS transistors 240 and 246, and 242 and 248, respectively. The control signals $c_p$ and $c_n$ are applied to control inputs 264 and 266, respectively. The input 264 is connected to the gate of PMOS transistor 244. The input 266 is connected to the gate of NMOS transistor 250. Connected to the inverting output 256 via a node 270 and to the noninverting output 258 via a node 272 are gates of NMOS transistor 274 and PMOS transistor 276. An input 278 connected to the transistor 274 and 276 provides a control voltage $V_{cap}$.

In operation, the delay through the delay cell results from charging and discharging of the capacitances on the nodes 260 and 262. The delay through the delay cell 226 can be altered by adjusting both the tail current $I_{NMOS}$ and the pullup current $I_{PMOS}$ through the control signals $c_n$ and $c_p$, respectively. The control signal $c_p$ is applied to the gate of the PMOS transistor 244 via the control input 264. The control signal $c_n$ is applied to the gate of the NMOS transistor 250 via the control input 266. NMOS transistors 246, 248, and 250 form a differential-pair controlling $I_{NMOS}$. Similarly, MOS transistors 240, 242, and 244 forms a complementary differential-pair that turn $I_{PMOS}$ OFF when $I_{NMOS}$ is ON. Thus, by making $I_{NMOS}$ equivalent to $I_{PMOS}$, the switch point of OUT and inverted OUT is near Vcc/2. As the pulldown current does not have to overcome the pullup current, as in the case of the delay cell of FIG. 2, the settling time $t_s$ for the cell is reduced.

The delay cell 226 has the advantage of consuming no power at D.C., and only consuming power when switching. Thus, the current drawn by the delay cell is proportional to the frequency of operation and the total capacitance of its outputs.

Compared to the delay cell 50 of FIG. 2, the delay cell 226 has a more nonlinear output. To compensate for this nonlinearity, variable capacitances are coupled to the inverting and noninverting outputs 256 and 258, respectively. Conveniently, the variable capacitors are provided by the gate capacitance of NMOS and PMOS transistors 274 and 276, respectively. The variable capacitors are controlled by the voltage signal $V_{cap}$. $V_{cap}$ is provided by a source follower using $C_{pump}$ the output of charge pump 86 as an input signal.

The harmonic lock detector 222 includes D-type flip-flops 300, 302, 304, 306, 308, 310, and 312, NAND gates 314, 316, 318, and 320, an OR gate 322, and an inverter 324. D-type flip-flops 300 through 308 have reset inputs. The D-type flip-flop 300 has connected to its reset input via the inverter 324, a reset signal. The D-type flip-flop 300 has its inverted output Q bar connected to its D input, and its clock input CK connected to the $\phi_o$ clock signal from DDL 220 of FIG. 6. The output Q of D-type flip-flop 300 is connected, after inversion, to the reset input R of D-type flip-flops 302 through 308 and to the clock input CK of D-type flip-flops 310 and 312. $V_{cc}$ is connected to the data input D of D-type flip-flops 302 through 308. The clock input CK of D-type flip-flop 302 receives the $\phi_7$ clock signal from DDL 200 of FIG. 6. The clock input CK of D-type flip-flops 304 and 306 each receives the $\phi_{17}$ clock signal from DDL 220 of FIG. 6. The clock input CK of D-type flip-flop 308 receives the $\phi_{29}$ clock signal from DDL 220 of FIG. 6.

NAND gates 314 and 316 are interconnected to form a not S - not R latch 326. The Q output of D-type flip-flops 302 and 304 are connected to the not S and not R inputs, respectively, of the latch 326. The Q bar output of the latch 326 is connected to the data input D of the D-type flip-flop 310. Similarly, NAND gates 318 and 320 are interconnected to form a not S - not R latch 328. The Q output of D-type flip-flops 306 and 308 are connected to the not S and not R inputs, respectively, of the latch 328. The Q bar output of the latch 328 is connected to the data input D of the D-type flip-flop 312. The Q bar output of D-type flip-flops 310 and 312 are connected to the inputs of the OR gate 322. The output of OR gate 322 provides a harmonic lock signal at output 380.

FIG. 9 provides a timing diagram representative of the operation of the harmonic lock detector of FIG. 8.

In operation, the D-type flip-flop 300, clocked by the $\phi_o$ clock signal provides a reference clock signal refclk having a period twice that of the $\phi_o$ clock signal and a 50% duty cycle. The reference clock signal refclk is then used to reset D-type flip-flops 302 through 308 and to clock D-type flip-flops 310 and 312. When refclk is low D-type flip-flops 302 through 308 are reset, which initiates a race condition between the clock signals $\phi_7$, $\phi_{17}$, and $\phi_{29}$. Normally, that is when the DLL is locked to the fundamental clock frequency, the clock signals $\phi_7$, $\phi_{17}$, and $\phi_{29}$, falling edges follow each other in time as indicated by bracket A in FIG. 9. In this instance, the Q bar output of latch 326 (hrmlck1) and the Q bar output of latch 328 (hrmlck2) remain low. When a lengthening of a cycle of the clock signal $\phi_{17}$ occurs due to some disruptive event, it becomes the first falling edge followed by the clock signals $\phi_{29}$, then $\phi_7$. This condition is indicated by bracket B in FIG. 9 and results in the Q bar output of latch 326 going low. The remaining permutation of the clock signals $\phi_7$, $\phi_{17}$, and $\phi_{29}$, is indicated by bracket C in FIG. 9. In this instance, the falling edge of clock signal $\phi_7$ is followed by that of $\phi_{29}$, then $\phi_{17}$ and results in the Q bar outputs of latch 326 going high and latch 328 going low. For harmonic lock to the second, third, fourth, sixth, eighth, and ninth harmonics, the situation illustrated by bracket B exists, hence the signal hrmlckl indicates this condition. For harmonic lock to the fifth, seventh, and tenth harmonic, the situation illustrated by bracket C exists, hence the signal hrmlck2 indicated this condition. Logically, ORing the two signals hrmlckl and hrmlck2 provides a harmonic lock signal indicative of harmonic lock condition for second through tenth harmonics. As the DDL has only enough dynamic range to obtain a lock on the fourth harmonic, which under extremes due to temperature and process variations might be extended to the fifth or possibly the seventh harmonic, harmonic lock detection to the tenth harmonic is adequate for the second embodiment of the present invention.

Numerous modifications, variations and adaptations may be made to the particular embodiment of the invention described above without departing from the scope of the invention, which is defined in the claims.

What is claimed is:

1. A circuit for providing an on-chip substantially constant delay in a signal path, comprising:
   a delay cell within the signal path requiring a substantially constant delay, the delay cell including
   a CMOS differential amplifier having pullup and pulldown currents being controlled by first and second control signals, respectively; and
   a delay lock loop for maintaining the substantially constant delay through the delay cell,
   the delay lock loop including:
   a delay line comprising a plurality of serially connected delay cells identical to the delay cell within the signal path, an input for receiving a reference clock signal, and an output for providing a delayed clock signal; a phase detector connected to the delay line and having outputs indicative of a phase difference between the delayed clock signal relative to the reference clock signal;
   a charge pump connected to the outputs of the phase detector and having a capacitor for providing an output signal therefrom;
   a bias generator having an input connected to receive the output signal of the charge pump for providing first and second control signals; and
   a harmonic lock detector having a plurality of inputs connected to a preselected plurality of delay cells for receiving multiple phases of the clock signal and an output for providing a harmonic lock indication signal in dependence upon relative phases of the phase of the clock signal.

2. A circuit as claimed in claim 1 wherein the CMOS differential amplifier includes a NMOS transistor for controlling the pulldown current from a differential-pair in response to a first control signal and an PMOS transistor for controlling the pullup current to a complementary differential pair in response to a second control signal.

3. A circuit as claimed in claim 2 wherein the delay line includes differential input to single output buffers each connected to the output of one of the delay cells.

4. A circuit as claimed in claim 3 wherein the buffers include a bias input for varying delay through the buffer.

5. A circuit as claimed in claim 1 wherein the phase of delayed clock signal is about 360° with respect to the reference clock signal.

6. A circuit as claimed in claim 5 wherein the phase of the delayed clock signal is $\phi_n$, the phase of the reference clock signal is $\phi_o$, and the delay lock loop maintains a phase relationship defined by $\phi_n = \phi_o + 360°$.

7. A circuit as claimed in claim 6 wherein n=32, and the multiple phases include $\phi_7 \phi_{17}$, and $\phi_{29}$.

8. A circuit for providing an on-chip substantially constant delay in a signal path, comprising:
   a delay cell within the signal path requiring a substantially constant delay, the delay cell including a CMOS differential amplifier having a NMOS transistor for controlling a pulldown current from a differential-pair in response to a first control signal and an PMOS transistor for controlling a pullup current to a complementary differential pair in response to a second control signal; and,
   a delay lock loop for maintaining the substantially constant delay through the delay cell,
   the delay lock loop including:
   a delay line comprising a plurality of serially connected delay cells identical to the delay cell within the signal path, an input for receiving a reference clock signal, and an output for providing a delayed clock signal;
   a phase detector connected to the delay line and having outputs indicative of a phase difference between the delayed clock signal relative to the reference clock signal;
   a charge pump connected to the outputs of the phase detector and having a capacitor for providing an output signal therefrom; and
   a bias generator having an input connected to receive the output signal of the charge pump for providing first and second control signals.

* * * * *